(12) United States Patent
Gong et al.

(10) Patent No.: US 9,411,383 B2
(45) Date of Patent: Aug. 9, 2016

(54) FACEPLATE FOR A COMPUTING DEVICE

(71) Applicant: Cisco Technology, Inc., San Jose, CA (US)

(72) Inventors: Luli Gong, Shanghai (CN); Jing An, Shanghai (CN); Luo Yonghong, Shanghai (CN); Tie Ma, Shanghai (CN); Harvey Yang, Shanghai (CN); Xiaoxia Zhou, Shanghai (CN)

(73) Assignee: Cisco Technology, Inc., San Jose, CA (US)

( * ) Notice: Subject to any disclaimer, the term of this patent is extended or adjusted under 35 U.S.C. 154(b) by 59 days.

(21) Appl. No.: 14/487,919

(22) Filed: Sep. 16, 2014

(65) Prior Publication Data

US 2016/0077556 A1    Mar. 17, 2016

(51) Int. Cl.
*H05K 7/20* (2006.01)
*G06F 1/18* (2006.01)
*H05K 5/02* (2006.01)
*H05K 5/04* (2006.01)
*B21C 23/02* (2006.01)
*B23C 3/12* (2006.01)

(52) U.S. Cl.
CPC ............... *G06F 1/181* (2013.01); *B21C 23/02* (2013.01); *B23C 3/12* (2013.01); *H05K 5/02* (2013.01); *H05K 5/04* (2013.01); *B23C 2220/16* (2013.01)

(58) Field of Classification Search
CPC ... H05K 5/04; H05K 5/0213; H05K 7/20563; B23C 2220/16
See application file for complete search history.

(56) References Cited

U.S. PATENT DOCUMENTS

| 8,911,033 | B2 * | 12/2014 | Li | ............... | H05K 5/0213 312/223.2 |
| 8,964,385 | B2 * | 2/2015 | Lam | ............... | H05K 7/20727 174/377 |
| 8,976,536 | B2 * | 3/2015 | French, Jr. | ............... | H05K 7/1427 16/221 |

OTHER PUBLICATIONS

Geekshed—M1BXF, Dec. 23, 2014, geekshed.co.uk/2013/12/23/.

* cited by examiner

*Primary Examiner* — Anthony Q Edwards
(74) *Attorney, Agent, or Firm* — Lempia Summerfield Katz LLC

(57) ABSTRACT

In one embodiment, an apparatus includes a faceplate for a computing device. The faceplate includes a first side and a second side. The faceplate also includes a chamfer formed between the first side and the second side. The chamfer runs along at least a portion of the first side and the second side. The chamfer includes at least one hole extending through only the chamfer.

20 Claims, 4 Drawing Sheets

FACEPLATE FOR A COMPUTING DEVICE

FIELD

The present embodiments relate to a faceplate for a computing device.

BACKGROUND

Data centers include computer and communication equipment stacked in a chassis. For cooling purposes, computer and communication equipment draws air from the surrounding environment into the equipment at one side and exhausts the air out of the equipment at another side. The airflow direction for the chassis may, for example, be front to back. Some computer and communication equipment such as, for example, aggregation switches (e.g., top-of-rack switches) and line cards includes a plurality of I/O connectors (e.g., RF45 connectors or SFP connectors) that occupy a substantial portion of the front of the computer and communication equipment. This leaves the available surface area around the I/O connectors for vent holes through which cooling air flows into the computer and communication equipment. If the vent holes are made too large or are positioned too close together within the available surface area on the front of the computer and communication equipment, electromagnetic interference and structural strength issues may arise.

DETAILED DESCRIPTION

Figure 1:
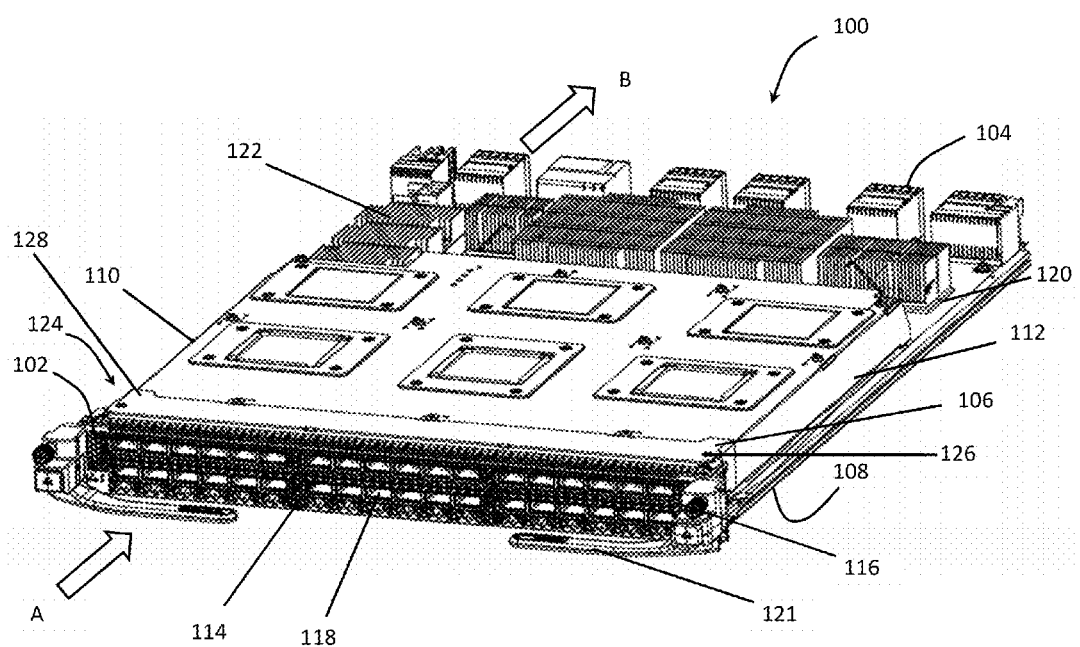
FIG. 1 shows a perspective view of one embodiment of a computer device.

In order to increase an airflow volume through a faceplate of a computing device, a chamfer is formed between two sides of the faceplate, and vent holes are formed through the chamfer. The vent holes are included within the chamfer and do not extend through at least one of the two sides.

In a first aspect, an apparatus includes a faceplate for a computing device. The faceplate includes an outer side including a first side and a second side. The faceplate also includes a chamfer formed between the first side and the second side of the faceplate. The chamfer runs along at least a portion of the first side and the second side. The faceplate includes at least one hole extending through the faceplate. The at least one hole extends through only the chamfer.

In a second aspect, an apparatus includes a processor and a housing that supports the processor. The housing includes a front and a top. At least a portion of an edge formed by the front of the housing and the top of the housing is a beveled edge. The beveled edge includes at least one first hole that extends through the housing. The at least one first hole is through only the beveled edge or through only the beveled edge and the front of the housing. The front includes at least one second hole that extends through the housing. The at least one second hole is through only the front.

In a third aspect, a method includes extruding a face plate of a switch housing. The extruded face plate includes an inner side and an outer side. The outer side includes a first outer side, a second outer side, and a third outer side. The first outer side extends between the second outer side and the third outer side. The method also includes forming a chamfer along an edge between the first outer side of the extruded face plate and the second outer side of the extruded face plate. The method includes forming a hole extending from the chamfer to the inner side. The hole terminates on the outer side only on the chamfer, and the hole is in a direction perpendicular to the chamfer.

Airflow through a chassis or rack supporting a number of stacked switches and/or routers, for example, may be from front to back. Vent holes on faceplates of the stacked switches and/or routers located at the front of the chassis, for example, allow air to be pulled or pushed through the stacked switches and/or routers for thermal management of the chassis.

Each faceplate includes openings to accommodate a large number of input/output (I/O) connectors (e.g., 36 I/O connectors) extending through the faceplate. The I/O connectors leave little space for the vent holes. For high power consumption switches and routers (e.g., 1,500 W), for example, key components (e.g., a central processing unit (CPU)) within the switch or router may overheat without proper thermal management.

If the vent holes are too large or are positioned to close together, the vent hole openings may cause electro-magnetic interference and/or structural strength issues. In order to increase airflow through the switch or router, and thus the chassis, while not increasing or minimally increasing electro-magnetic interference, a chamfer is provided between the front and the top, bottom, or sides of the face plate, and a number of vent holes extending through the chamfer are provided.

FIG. 1 illustrates a perspective view of one embodiment of a switch 100. The switch 100 may be one of a plurality of switches stacked in and supported by a chassis (not shown). The switch 100 includes a front 102, a back 104, a top 106, a bottom 108, a first side 110, and a second side 112. In the embodiment shown, the switch 100 does not include a cover, as the chassis may act as a cover when the switch 100 is installed in the chassis. In another embodiment, the switch 100 includes a cover that surrounds any combination of the front 102, the back 104, the top 106, the bottom 108, the first side 110, and the second side 112.

The front 102 of the switch 100 includes a plurality of openings 114 (e.g., vent holes) through which air used to cool the switch 100 flows. The front 102 also includes a plurality of openings 116 for corresponding I/O connectors 118, for example.

The switch 100 includes any number of components including, for example, the I/O connectors 118, a plurality of heat generating electrical hardware components 120, a plurality of fans (not shown), a plurality of baffles (not shown), and other thermal management components (e.g., heat pipes). The I/O connectors 118, the plurality of heat generating electrical hardware components 120, the plurality of fans, the plurality of baffles, the other thermal management components, or a combination thereof may be supported by and/or attached to (e.g., with an adhesive, screws, nut/bolt combinations, snaps, mated press fittings, other attachment devices, or a combination thereof) the bottom 108. The switch 100 may include different, additional, or fewer components. For example, the switch 100 includes one or more rotatable levers 121 operable to lock the switch 100 in the chassis.

The I/O connectors 118 may be any number of I/O connectors 118 including, for example, RJ45 connectors or SFP connectors. The I/O connectors 118 may be used for only input, only output, or both input and output connections.

The plurality of heat generating electric hardware components 120 may include heat sinks 122 to aid in the transfer of heat from the plurality of heat generating electric hardware components 120 to the surrounding air. The plurality of heat generating electric hardware components 120 may include, for example, processors, circuits, transistors, memory devices, power supplies, transformers, chips, integrated circuits, or other electronics.

The plurality of fans pull or push (e.g., depending on the direction the plurality of fans are positioned within the switch 100) air into or out of the plurality of openings 114. In one embodiment, air is pulled into the switch 100 through the plurality of openings 114 in the direction of arrow A, and at least a portion of the air is pushed out of the switch 100 at the back 104, as indicated by arrow B. In another embodiment, the flow of air is reversed, as air is pulled into the switch 100 at the back 104 and pushed out of the switch 100 through the plurality of openings 114 at the front 102.

The front 102 of the switch 100 may be formed by a faceplate 124. The faceplate 124 includes the plurality of openings 114 for airflow and the plurality of openings 116 for the I/O connectors 118. The faceplate 124 may be attached to the switch 100 in any number of ways. For example the faceplate 124 may be attached to the switch 100 with a plurality of fasteners 126 at one or more flanges 128 of the faceplate 124. The plurality of fasteners 126 may include, for example, screw/tapped screw hole or nut/bolt combinations, but other connections such as snap or press fits or rivets may be used.

The plurality of openings 114 are provided for thermal management purposes. Depending on the number of I/O connectors 118 and thus the size of the openings 116 provided for the I/O connectors 118 of the switch 100, there may be little space remaining for placement of the plurality of openings 114. For high power consumption switches or line cards, temperatures of one or more of the heat generating electrical hardware components during operation of the switch may be too high without sufficient airflow through the switch or line card to cool the one or more of the heat generating electrical hardware components. The switch or line card may not operate properly and/or may shut down with such high temperatures. If the openings 114 are made too large and/or positioned too close together, the openings 114 may cause electromagnetic interference and/or structural integrity issues.

Figure 2:
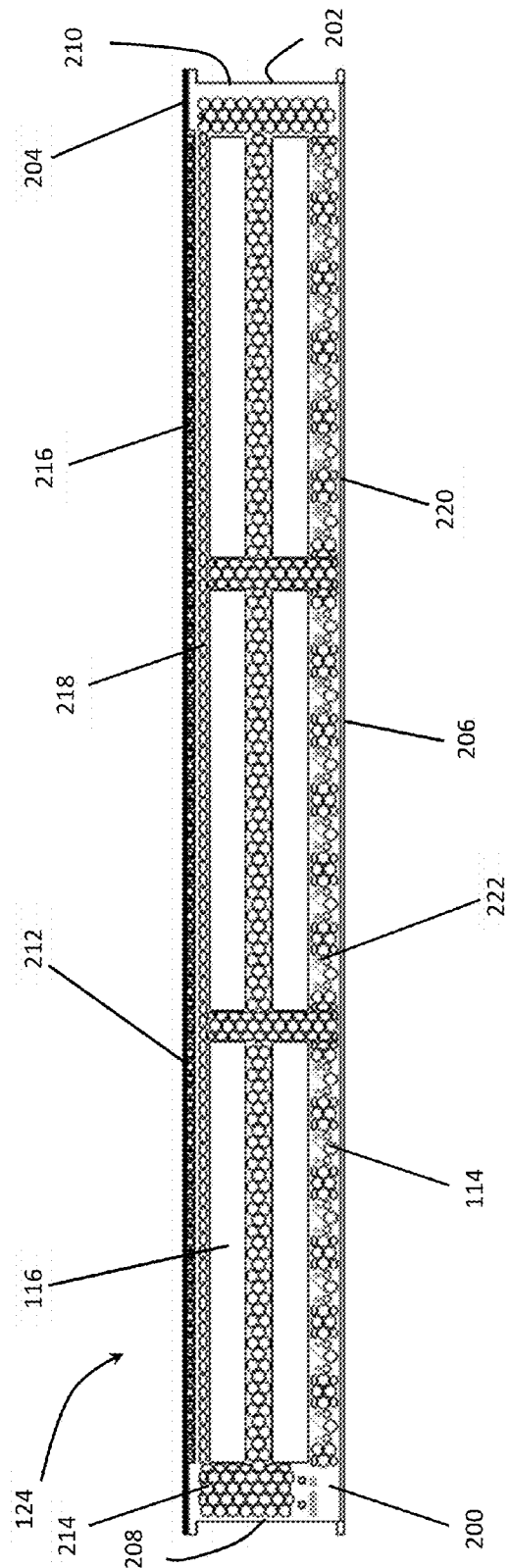
FIG. 2 shows a front view of one embodiment of a faceplate.

The faceplate of one or more of the present embodiments includes a chamfer that increases the surface area through which openings may extend and air may flow. FIG. 2 shows a front view of one embodiment of the faceplate 124, which may form the front 102 and respective portions of the top 106, the bottom 108, the first side 110, and the second side 112 of the switch 100. The faceplate 124 may form one or more sides of another switch or line card. The faceplate 124 includes a front 200, a back 202, a top 204, a bottom 206, a first side 208, and a second side 210. A chamfer or flange 212 is formed between the front 200 and the top 204 of the faceplate 124 (e.g., along an edge formed by the front 200 and the top 204 (a front-top edge)). The chamfer 212 extends along less than all of the front-top edge. In other embodiments, the chamfer 212 extends along the entire front-top edge. More or different chamfers may be formed between other or different sides (e.g., front and side and/or front and bottom) of the faceplate 124.

In one embodiment, the faceplate 124 is made of aluminum and is formed using an extrusion manufacturing process. The chamfer 212 and the plurality of openings 114 are formed using a CNC milling machine. In other embodiments, the faceplate 124 is made of a different and/or additional materials, and/or the faceplate 124 is manufactured in a different way.

FIG. 2 shows the plurality of openings 114 (e.g., vent holes) positioned around the openings 116 for the I/O connectors 118, on the front 200 of the faceplate 124, and positioned on the chamfer 212. In the embodiment shown in FIG. 2, the faceplate 124 includes six openings 116 for the I/O connectors 118. The faceplate 124 may include more or fewer openings 116. The number and size of the openings 116 for the I/O connectors 118 may be set based on the number of I/O connectors 118.

Each of the vent holes 114 may be hexagonal or semi-hexagonal. Semi-hexagonal may include half hexagons, one-third hexagons, or other portions of a hexagon. The hexagonal or semi-hexagonal vent holes 114 may be rounded (e.g., with rounded portions having a radius of 0.03 in.). With respect to electromagnetic interference (EMI), use of hexagonal shapes for the vent holes 114 may be advantageous in that EMI contribution is based on a longest dimension for the hole or opening; a hexagonal opening has an advantageous ratio of longest dimension length to opening area compared to other shapes (e.g., a rectangle). The hexagonal vent holes and the semi-hexagonal vent holes may be any number of dimensions. For example, the height of each hexagonal vent hole 114 may be 0.126 in., and each of the sides of the hexagonal vent holes 114 may be 0.073 in. At least some vent holes of the plurality of vent holes 114 may be arranged in a honeycomb pattern. Columns of vent holes 214 may include hexagonal vent holes 114 with centers in line in a direction parallel to the first side 208 and/or the second side 210 and/or perpendicular to the top 204 and/or the bottom 206. Hexagonal vent holes 114 of a column of vent holes 214 may be spaced apart 0.013 in. from each other, for example. Centers of adjacent hexagonal vent holes 114 in a direction perpendicular to the first side 208 and/or the second side 210 may be 0.120 in. apart from each other. Other shapes (e.g., circles), sizes, and/or arrangement patterns may be provided for the plurality of vent holes 114.

In one embodiment, a first portion of vent holes of the plurality of vent holes 114 are hexagonal, and a second portion of vent holes of the plurality of vent holes 114 are semi-hexagonal. The second portion of vent holes 114 includes a row of vent holes 216 positioned along the chamfer 212 and extending through the chamfer 212. The row of vent holes 216 positioned along the chamfer 212 may include, for example, 106 vent holes 114. More or fewer vent holes 114 may be provided. The vent holes 114 of the row of vent holes 216 may be positioned one after another along the chamfer 212. Alternatively, groups of vent holes 114 may be spaced apart from each other.

Vent holes 114 of the row of vent holes 216 may be positioned entirely within the chamfer 212. In other words, vent holes 114 of the row of vent holes 216 do not extend into the front 200 or the top 204 of the faceplate 124. In other embodiments, at least a portion of the vent holes 114 of the row of vent holes 216 may extend through the chamfer 212 and the front 200 of the faceplate 124. Vent holes 114 of the row of vent holes 216 may be half-hexagonal. In other embodiments, the chamfer 212 is large enough that full hexagonal vent holes 114 may extend through just the chamfer 212 and/or more than one row of vent holes may extend along the chamfer 212.

The second portion of vent holes 114 may also include one or more rows of vent holes 218 (e.g., one row of vent holes) above a top row of the openings 116 for the I/O connectors 118, and may include one or more rows of vent holes 220 (e.g., two rows of vent holes) below a bottom row of the openings 116 for the I/O connectors 118. The vent holes 114 of the row of vent holes 218 may be positioned one after another, while the vent holes 114 of the two rows of vent holes 220 may be grouped together with the groups being spaced apart from each other. The spacing allows for numbering 222 of the I/O connectors 118.

Figure 3:
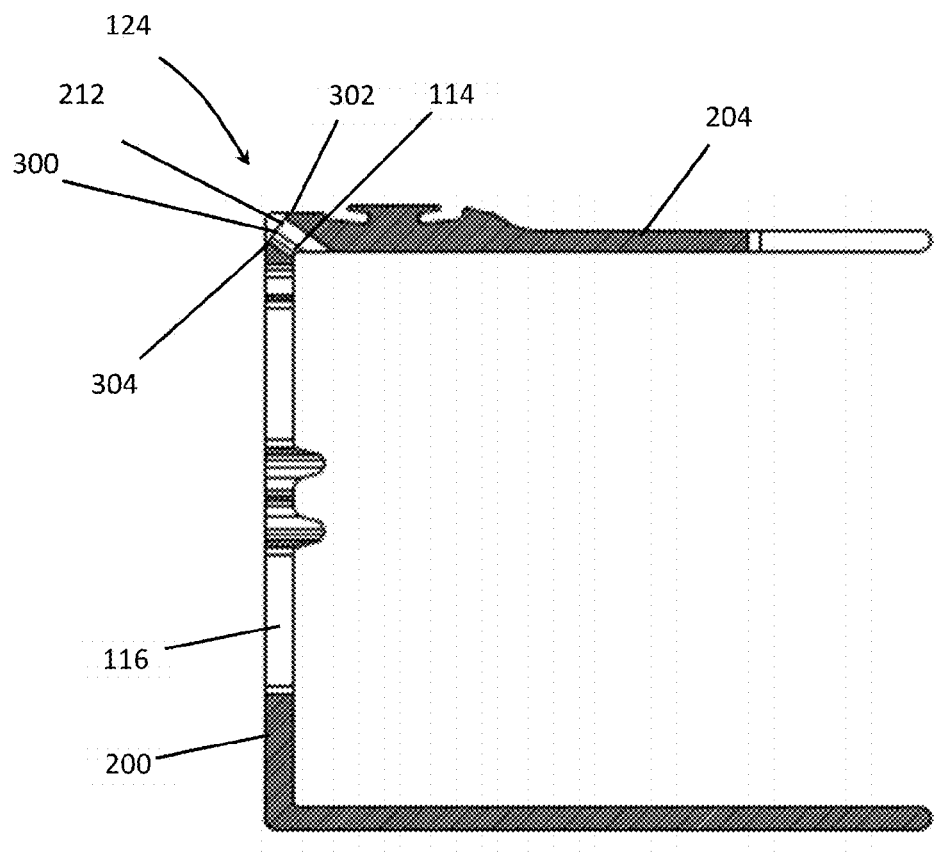
FIG. 3 shows a cross-sectional side view of the embodiment of the faceplate shown in FIG. 2.

FIG. 3 shows a cross-sectional side view of the embodiment of the faceplate 124 shown in FIG. 2. As shown in the embodiment of FIG. 3, the cross-section of the faceplate 124 is U-shaped. The U-shaped cross-section may form a channel. Any thickness of the U-shaped faceplate 124 is provided. The cross-section of the faceplate 124 may be any number of other shapes. For example, the cross-section of the faceplate 124 may be L-shaped.

FIG. 3 shows the chamfer 212 and one of the vent holes 114 of the row of vent holes 216 positioned along the chamfer 212. The chamfer 212 may be formed at any number of angles relative to the front 200 or the top 204 of the faceplate 124. For example, the chamfer 212 may be formed at an angle of 35° relative to the front 200 of the faceplate 124. Such an angle of the chamfer 212 relative to the front 200 of the faceplate 124 balances the positive effects of increased air flow through the faceplate 124 and thus cooling of the switch 100, for example, and the negative effects of electromagnetic interference (EMI) resulting from increasing the open area on the faceplate.

The vent holes 114 of the row of vent holes 216 may be only through the chamfer 212. In other words, the vent holes 114 may be included entirely within the chamfer 212 and may not be through the front 200 or the top 204 of the faceplate 124, for example. The vent holes 114 may extend in a direction perpendicular to the chamfer 212. Alternatively, the vent holes 114 may extend in a different direction relative to the chamfer 212. The chamfer 212 may include a front surface 300, a top edge 302, and a bottom edge 304. The chamfer 212 may be just the front surface 300, or may also include material 306 of the faceplate 124 bounded by the top edge 302 and the bottom edge 304, extending in a direction perpendicular to the front surface 300 of the chamfer 212. More or less of the faceplate 124 may be considered part of the chamfer 212.

For certain applications, the power budget for a switch or line card may be over 1,500 W. Thermal management thus becomes a challenge for the switch or line card. The additional vent holes 114 through the increased surface area provided by the chamfer 212 allows an increased airflow volume to flow through the faceplate compared to faceplates of the prior art that do not include the chamfer. With the greater airflow volume through the faceplate and thus the switch, a thermal management system (e.g., including fans, heat sinks, etc.) of the switch may better cool the high power switch.

Figure 4:
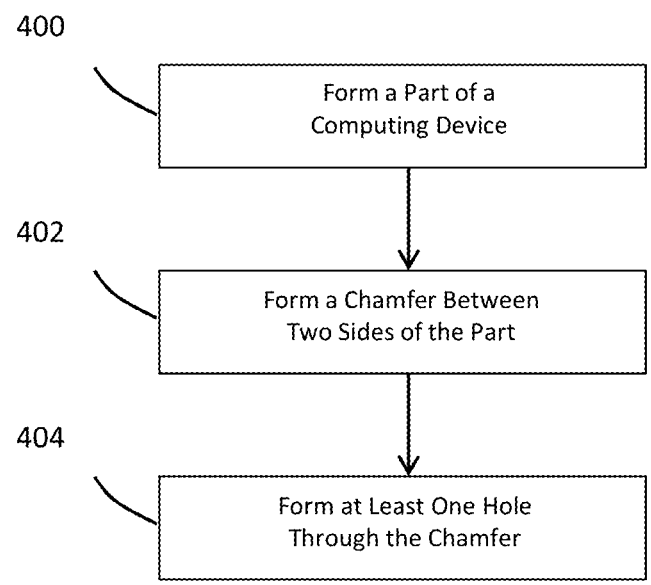
FIG. 4 shows a flowchart of one embodiment of a method for manufacturing a portion of a computing device.

FIG. 4 shows a flowchart of one embodiment of a method for manufacturing a faceplate of a computing device. The method may be used to manufacture a faceplate of a switch or line card. The method is implemented in the order shown, but other orders may be used. Additional, different, or fewer acts may be provided.

In act 400, a part of a computing device is formed using an extrusion process. The part of the computing device may be a faceplate of a switch or a line card. The extruded faceplate includes a front, a back, a top, a bottom, a first side, and a second side. The extruded faceplate may include additional sides. For example, the extruded faceplate may include an outer side and an inner side. The outer side may include at least a first outer side, a second outer side, and a third outer side. The first outer side, the second outer side, and the third outer side may form the outside of a "U" shape.

The extrusion process includes a material being pushed or drawn through a die to form the extruded part (e.g., the faceplate). Hot or cold extrusion may be used. Any number of different materials may be extruded to form the faceplate. In one embodiment, aluminum is extruded to form the faceplate. After the material is pushed or drawn through the die to form the faceplate, the faceplate may be stretched to straighten the faceplate. Additionally, the faceplate may be heat treated or cold worked after being extruded.

The die used in the extrusion process may be U-shaped, such that the cross-section of the faceplate is also U-shaped. The "U" may be any number of dimensions. For example, the bottom portion of the "U" may be sized to fit the height of the switch. The length and thickness of the extruded part (e.g., the faceplate) may be any number of dimensions. For example, the length and/or the thickness of the faceplate may be dependent on the size and/or weight of the computing device on which the faceplate is to be used. The thickness may be variable around the U of the U-shaped faceplate or may be uniform. Any number of other shaped dies may be used in the extrusion process to form faceplates of different shapes. For example, the die may be L-shaped to form an L-shaped faceplate.

In act 402, a chamfer is formed between two sides of the faceplate. The chamfer is formed by milling an edge formed by the two sides of the faceplate. The faceplate may be milled to form the chamfer using, for example, a CNC milling machine. The chamfer may be formed in any number of other ways including, for example, by bending a sheet of metal to form a front, an angled portion (corresponding to the chamfer), and a top or as part of the extrusion process.

In one embodiment, the chamfer is formed between the front and the top of the faceplate. Chamfers may be formed between different and/or additional pairs of sides of the faceplate. For example, in addition or alternative to the chamfer formed between the front and the top of the faceplate, a chamfer may be formed between the front and the first side of the faceplate, and a chamfer may be formed between the front and the second side of the faceplate. The chamfer is formed at an angle of, for example, 35° relative to the front of the faceplate. The chamfer may be formed at any number of other angles relative to the front of the faceplate. The chamfer may be at the same angle relative to the front of the faceplate, along the length of the chamfer. Alternatively, the angle of the chamfer relative to the front of the faceplate may vary along the length of the chamfer.

In act 404, at least one hole (e.g., at least one vent hole) is formed through the chamfer. The at least one hole may be formed through the chamfer using, for example, milling. The CNC milling machine used to form the chamfer in act 402 may be used to form the at least one hole through the chamfer. Another milling machine or another process (e.g., etching) may be used to form the at least one hole through the chamfer.

On an outer surface of the faceplate, the at least one hole may be included entirely within the chamfer. In other words, looking at the front of the faceplate, the at least one hole extends through only the chamfer, and parts of the hole do not terminate at the front or the top of the faceplate. In one embodiment, the at least one hole includes a plurality of holes extending through the chamfer. The plurality of holes may include, for example, 106 holes extending through the chamfer. The at least one hole may include more or fewer holes extending through the chamfer. Each hole of the plurality of holes may terminate only in the chamfer. In another embodiment, each hole of the plurality of holes terminates in only the chamfer and the front of the faceplate. In yet another embodiment, each hole of a first portion of the plurality of holes terminates through only the chamfer, and each hole of a second portion of the plurality of holes terminates through only both the chamfer and the front of the faceplate. In one embodiment, at least some holes of the plurality of holes terminate through the chamfer and the front and the top of the faceplate. For embodiments with a chamfer formed between a pair of sides different than the front and the top of the faceplate, holes may terminate through only the chamfer, and/or holes may terminate through only the chamfer and one or more sides of the faceplate (e.g., the front).

Each hole of the plurality of holes formed in the chamfer may be hexagonal or semi-hexagonal. Semi-hexagonal may include half hexagons, one-third hexagons, or other portions of a hexagon. For example, each hole of the plurality of holes formed through the chamfer may be a half hexagon. The hexagonal or semi-hexagonal holes may be rounded (e.g., with rounded portions having a radius of 0.03 in.). The hexagonal holes and the semi-hexagonal holes may be any number of dimensions. For example, the height of each hexagonal hole may be 0.126 in., and each of the sides of the hexagonal hole may be 0.073 in.

Other openings and holes may be formed in the faceplate using, for example, the CNC milling machine used in acts 402 and 404. For example, a plurality of openings (e.g., six rectangular openings; three columns and two rows of openings), through which I/O connectors may extend, may be formed in the front of the faceplate. Additionally, a plurality of holes (e.g., vent holes) may be formed in the front of the faceplate, around the plurality of openings for the I/O connectors. The plurality of holes formed in the front of the faceplate may be hexagonal or semi-hexagonal. At least some holes of the plurality of holes formed in the front of the faceplate may be sized and/or shaped like the holes through the chamfer.

At least some holes of the plurality of holes formed in the front of the faceplate may be arranged in a honeycomb pattern. Columns of the holes formed in the front of the faceplate may include hexagonal vent holes with centers in line in a direction parallel to the first side and/or the second side and/or perpendicular to the top and/or the bottom of the faceplate. Hexagonal vent holes of a column of vent holes formed in the front of the faceplate may be spaced apart 0.013 in. from each other, for example. Centers of adjacent hexagonal vent holes formed in the front of the faceplate, in a direction perpendicular to the first side and/or the second side may be 0.120 in. apart from each other. Other shapes (e.g., circles), sizes, and/or arrangement patterns may be provided for the vent holes formed in the front of the faceplate.

In operation, one or more fans of the switch push or pull air through the holes in the chamfer and the holes in the front of the faceplate. For example, for a switch with cooling airflow that moves front to back, the one or more fans pull cooling air through the holes formed in the chamfer and the holes formed in the front of the faceplate. The one or more fans then pull or push the cooling air past computing devices of the switch to be cooled, and push the cooling air out the back of the switch (e.g., through one or more holes in the back of the switch). The holes formed in the chamfer of the faceplate allow a greater volume of cooling air to pass through the faceplate and thus improve cooling of computing devices to be cooled (e.g., processors of a switch) compared to faceplates not including the chamfer and the vent holes formed in the chamfer.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An apparatus comprising:
    a faceplate for a computing device, the faceplate comprising:
        a first side connected to a second side, each including an inner side and outer side, wherein the inner side of the first side and the inner side of the second side are directly connected; and
        a chamfer formed between the outer side of the first side and the outer side of the second side, the chamfer running along at least a portion of the first side and the second side; and
    at least one hole extending through the faceplate, the at least one hole extending through only the chamfer.

2. The apparatus of claim 1, wherein the at least one hole comprises a plurality of holes extending through the faceplate, through only the chamfer.

3. The apparatus of claim 1, wherein the shape of the at least one hole is hexagonal or half hexagonal.

4. The apparatus of claim 1, wherein the faceplate is made of aluminum.

5. The apparatus of claim 1, wherein the faceplate is attachable to a housing of a switch.

6. The apparatus of claim 1, wherein the first side is a front of the faceplate, and the second side is a top of the faceplate.

7. An apparatus comprising:
    a faceplate for a computing device, the faceplate comprising:
        an outer side comprising a first side and a second side; and
        a chamfer formed between the first side and the second side of the faceplate, the chamfer running along at least a portion of the first side and the second side and wherein the angle of the chamfer relative to the front of the faceplate is 35°; and
    at least one hole extending through the faceplate, the at least one hole extending through only the chamfer.

8. The apparatus of claim 7, wherein the at least one hole extends through the faceplate in a direction perpendicular to the chamfer.

9. An apparatus comprising:
    a processor; and
    a housing that supports the processor, the housing comprising a front connected to a top, each including an inner side and outer side, wherein the inner side of the front side and the inner side of the top side are directly connected and at least a portion of an edge formed by the front of the housing and the top of the housing being a beveled edge,
    wherein the beveled edge comprises at least one first hole that extends through the housing, the at least one first hole being through only the beveled edge or through only the beveled edge and the front of the housing, and
    wherein the front comprises at least one second hole that extends through the housing, the at least one second hole being through only the front.

10. The apparatus of claim 9, wherein the beveled edge is at an angle of 35° relative to the front of the housing.

11. The apparatus of claim 9, wherein the front of the housing is formed by a removably attached faceplate.

12. The apparatus of claim 9, wherein the apparatus is a switch.

13. The apparatus of claim 9, wherein the at least one first hole comprises a plurality of first holes, and wherein the at least one second hole comprises a plurality of second holes.

14. The apparatus of claim 13, wherein each first hole of the plurality of first holes is half hexagonal, and
wherein the plurality of second holes are hexagonal, half hexagonal, or a combination thereof.

15. The apparatus of claim 13, wherein the housing further comprises a back and a bottom, the back comprising at least one third hole that extends through only the back, the bottom supporting the processor, wherein the apparatus further comprises a fan supported by the bottom, the fan being operable to pull air through the at least one first hole and the at least one second hole, pull or push the air around the processor, and push the air through the back.

16. The apparatus of claim 15, wherein the front comprises at least one opening, the plurality of second holes being positioned around the at least one opening, and
wherein the housing further supports a plurality of input/output connectors, the plurality of input/output connectors being accessible through the at least one opening.

17. A method comprising:
extruding a face plate of a switch housing, the extruded face plate comprising an inner side and an outer side, the outer side comprising a first outer side, a second outer side, and a third outer side and the inner side comprising a first inner side, a second inner side, and a third inner side, the first outer side extending between the second outer side and the third outer side and the first inner side extending between the second inner side and third inner side, where the first inner side is directly connected to the second inner side;
forming a chamfer along an edge between the first outer side of the extruded face plate and the second outer side of the extruded face plate; and
forming a hole extending from the chamfer to the inner side, the hole terminating on the outer side only on the chamfer, and the hole being in a direction perpendicular to the chamfer.

18. The method of claim 17, wherein forming the chamfer comprises milling the chamfer along a portion of the edge between the first outer side of the extruded face plate and the second outer side of the extruded face plate.

19. The method of claim 17, wherein forming the hole comprises milling the hole through only the chamfer.

20. The method of claim 17, wherein extruding the face plate comprises extruding aluminum in the shape of a channel.

* * * * *